(12) United States Patent
Wang et al.

(10) Patent No.: US 8,502,289 B2
(45) Date of Patent: Aug. 6, 2013

(54) DOUBLE GATE TRANSISTOR AND METHOD OF FABRICATING THE SAME

(75) Inventors: Xinpeng Wang, Beijing (CN); Haiyang Zhang, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 13/324,945

(22) Filed: Dec. 13, 2011

(65) Prior Publication Data

US 2013/0075811 A1    Mar. 28, 2013

(30) Foreign Application Priority Data

Sep. 22, 2011    (CN) .......................... 2011 1 0282916

(51) Int. Cl.
*H01L 29/76*    (2006.01)
(52) U.S. Cl.
USPC ........................................... 257/288
(58) Field of Classification Search
CPC .......... H01L 29/41761; H01L 29/66795; H01L 29/66803; H01L 29/6681; H01L 29/66818
USPC .......................... 257/288, 250, 270, 331, 722
See application file for complete search history.

(56) References Cited

U.S. PATENT DOCUMENTS

| 7,906,802 B2 * | 3/2011 | Baumgartner et al. ........ 257/255 |
| 2005/0127412 A1 * | 6/2005 | Cohen et al. .................. 257/288 |
| 2009/0101940 A1 * | 4/2009 | Barrows et al. ............... 257/204 |

* cited by examiner

*Primary Examiner* — N Drew Richards
*Assistant Examiner* — Ratisha Mehta
(74) *Attorney, Agent, or Firm* — Koppel, Patrick, Heybl & Philpott

(57) ABSTRACT

The present invention discloses a double gate transistor and a method of fabricating said transistor, said transistor comprising: a semiconductor layer on a substrate; a fin structure formed in said semiconductor layer, said fin structure having two end portions for forming source and drain regions and a middle portion between said two end portions for forming a channel region, said middle portion including two opposed side surfaces perpendicular to a substrate surface; a first gate dielectric layer and a first gate disposed on one side surface of said middle portion; and a second gate dielectric layer and a second gate disposed on the other side surface of said middle portion.

57 Claims, 12 Drawing Sheets

DOUBLE GATE TRANSISTOR AND METHOD OF FABRICATING THE SAME

CROSS-REFERENCE TO RELATED APPLICATIONS

This application claims priority to Chinese Patent Application No. 201110282916.7, filed on Sep. 22, 2011 and entitled "Double Gate Transistor and Method of Fabricating the Same", which is incorporated herein in its entirety by reference.

BACKGROUND OF THE INVENTION

1. Field of the Invention

The present invention relates to a semiconductor device and a fabricating method thereof and more specifically relates to a double gate transistor and method of fabricating the double gate transistor.

2. Description of the Related Art

The metal oxide semiconductor field effect transistor (MOSFET) technology is a currently-used primary electronic device technology. Generally, a dimension of a device is reduced to enhance the speed of the device, thereby realizing improvements in performance between devices of each subsequent generation. This is typically called "shrinkage in scale" of a device.

Ultra large scale integrated (ULSI) circuits generally comprise a great number of transistors which cooperate to perform various functions for an electronic device, wherein a complementary metal oxide semiconductor field effect transistor (CMOSFET) that includes a gate disposed between source and drain regions is most frequently used. The gate is provided on a gate oxide material. Generally, a material used to form the gate can be a metal or a poly-material such as poly-silicon, poly-germanium or poly-silicon germanium ($Si_xGe_{1-x}$), which controls the charge carrier in a channel region between the drain and source regions so as to turn a transistor on or off. The transistor can be an N-channel MOSFET or a P-channel MOSFET.

In a conventional MOSFET, source and drain regions are formed by doping a substrate; a gate is used for controlling current in a channel region. As a MOSFET is shrunk in scale to a channel length below 100 nm, a lot of problems occur for the conventional MOSFET. One major problem is that the interaction between the source and drain regions of the MOSFET decreases the ability of a gate to control the on or off state of a device, which is a phenomenon called "short channel effect (SCE)." It is difficult to overcome problems related to the short channel effect such as leakage current between source and drain regions as well as reduction of mobility.

Multi-gate MOSFETs have gates at multiple sides of a channel and thus can control gates from multiple sides, thereby reducing the SCE and increasing driving current. FIG. 1 schematically shows four structures for a double gate, a trigate, an Ω gate and a quadgate MOSFET.

As shown in FIGS. 1A-1D, the prior art multi gates 11G, 12G, 13G, 14G, respectively, are a double gate, a tri-gate, an Ω gate and a quadri-gate MOSFET 11, 12, 13, 14 are connected together and controlled by the same electrode, which is a disadvantage for separately controlling the multiple gates.

In addition, during the operation of the MOSFET device, in order to enhance carrier mobility of the device, a stress is typically applied on the channel region. However, in prior art multi-gate MOSFETs provided, it is difficult to effectively apply a desired stress on the channel region.

SUMMARY OF THE INVENTION

An object of the present invention is to provide a double gate transistor that is capable of separately controlling the two gates. Another object of the present invention is to provide a double gate transistor that is capable of effectively applying a stress on a channel.

According to a first aspect of the present invention, there is provided a double gate transistor, comprising: a semiconductor layer on a substrate; a fin structure formed in said semiconductor layer, said fin structure having two end portions for forming source and drain regions and a middle portion between said two end portions for forming a channel region, said middle portion including two opposite side surfaces perpendicular to a substrate surface; a first gate dielectric layer and a first gate disposed on one side surface of said middle portion; and a second gate dielectric layer and a second gate disposed on the other side surface of said middle portion, characterized in that said middle portion has a width larger than the two end portions for forming source and drain regions, said middle portion has a length larger than at least one of the first gate and the second gate, and a height of said first gate and a height of said second gate are both the same as a height of said middle portion, wherein the length runs along the channel direction, the height runs along a direction perpendicular to the substrate surface, and the width runs along a direction perpendicular to the length and the height.

Preferably, said first gate dielectric layer and said first gate are of the same length, and said second dielectric layer and said second gate are of the same length.

Preferably, said first gate dielectric layer and said first gate are of the same height, and said second dielectric layer and said second gate are of the same height.

Said first gate and said second gate can be different lengths or the same length.

Said first gate and said second gate can be different widths or the same width.

Preferably, said middle portion extends beyond two sides of the two end portions along the width direction.

Preferably, said middle portion extends beyond the two ends of said first gate along the length direction.

Preferably, the length that said middle portion extends beyond at least one of the two ends of said first gate along the length direction is ⅕-⅙ of the length of said first gate.

Preferably, said middle portion extends beyond the two ends of said second gate along length direction.

Preferably, the length that said middle portion extends beyond at least one of the two ends of said second gate along length direction is ⅕-⅙ of the length of said second gate.

Preferably, materials of said first gate and said second gate include at least one of poly-silicon, poly-germanium, poly-silicon germanium and a metal.

Said first gate and said second gate can be different materials or the same material.

Preferably, said double gate transistor further comprises a first contact and a second contact disposed on said first gate and said second gate respectively.

Preferably, materials of said first contact and said second contact include at least one of: W, Cu and Al.

Said first contact and said second contact can be the same material or different materials.

Preferably, materials of said first gate dielectric layer and said second gate dielectric layer include at least one of silicon oxide, silicon nitride and silicon nitride oxide.

Said first gate dielectric layer and said second gate dielectric layer can be the same material or different materials.

Said silicon nitride can include silicon nitride doped with P or F.

Preferably, said double gate transistor further comprises a stress layer disposed on said double gate transistor, wherein said stress layer covers the whole of said middle portion for forming a channel region, the whole of said first gate dielectric layer and said second gate dielectric layer, a portion of said first gate, a portion of said second gate, and a portion of said two end portions for forming source and drain regions.

Said stress layer can include silicon nitride in a compressive stress state or a tensile stress state.

According to a second aspect of the present invention, there is provided a method of fabricating a double gate transistor, comprising: providing a substrate with a semiconductor layer on its surface; forming a patterned hard mask on said semiconductor layer; etching said semiconductor layer with the hard mask to form a fin structure, said fin structure having two end portions for forming source and drain regions and a middle portion between said two end portions, side surfaces of said middle portion together with the respective adjacent side surfaces of said two end portions constituting two opposite side surfaces of said fin structure that are perpendicular to the substrate surface, wherein said middle portion has a width larger than the two end portions for forming source and drain regions; depositing gate dielectric and gate materials, so as to form a first stacked layer of the gate dielectric and gate materials on one side surface of said fin structure and a second stacked layer of the gate dielectric and gate materials on the other side surface of said fin structure, as well as to form a third stacked layer of the gate dielectric and gate materials on said hard mask; performing planarization by using said hard mask as a stop layer, so as to remove said third stacked layer and maintain said first stacked layer and said second stacked layer on the two opposite side surfaces of said fin structure, wherein the height of said first stacked layer and the height of said second stacked layer are both the same as the height of said middle portion; and selectively etching the gate dielectric and gate materials in said first stacked layer and said second stacked layer, so as to form a first gate dielectric layer and a second gate dielectric layer as well as a first gate and a second gate corresponding to said middle portion, and such that said middle portion has a length larger than at least one of the first gate and the second gate, wherein the length runs along the channel direction, the height runs along a direction perpendicular to the substrate surface, and the width runs along a direction perpendicular to the length and the height respectively.

Preferably, said first gate dielectric layer and said first gate are of the same length and said second gate dielectric layer and said second gate are of the same length.

The planarization can be performed by using a chemical mechanical polishing process.

Said first gate and said second gate can be different lengths or the same length.

Preferably, said first gate and said second gate can be different widths or the same width.

Preferably, said middle portion for forming a channel region extends beyond two sides of said two end portions for forming source and drain regions along the width direction.

Preferably, said middle portion extends beyond the two ends of said first gate along the length direction.

Preferably, the length that said middle portion extends beyond at least one of the two ends of said first gate along the length direction is 1/5-1/6 of the length of said first gate.

Preferably, said middle portion extends beyond the two ends of said second gate along the length direction.

Preferably, the length that said middle portion extends beyond at least one of the two ends of said second gate along the length direction is 1/5-1/6 of the length of said second gate.

Materials of said first gate and said second gate can include at least one of poly-silicon, poly-germanium, poly-silicon germanium and a metal.

Said first gate and said second gate can be different materials or the same material.

Preferably, said method further comprises removing said hard mask after the selective etching.

Preferably, said method further comprises forming a first contact and a second contact on said first gate and said second gate respectively.

Materials of said first contact and said second contact can include at least one of W, Cu and Al.

Said first contact and said second contact can be the same material or different materials.

A material of said hard mask includes at least one of silicon nitride oxide and silicon nitride.

Said hard mask can have a thickness of 50-100 Å.

Materials of said first gate dielectric layer and said second gate dielectric layer can include at least one of silicon oxide, silicon nitride and silicon nitride oxide.

Said first gate dielectric layer and said second gate dielectric layer can be the same material or different materials.

Said silicon nitride can include silicon nitride doped with P or F.

Preferably, said method further comprises placing a stress layer on said double gate transistor, wherein said stress layer covers the whole of said middle portion, the whole of said first gate dielectric layer and said second gate dielectric layer, a portion of said first gate, a portion of said second gate, and a portion of said two end portions.

A material of said stress layer can include silicon nitride in a compressive stress state or tensile stress state.

Further features of the present invention and advantages thereof will become apparent from the following detailed description of exemplary embodiments incorporating features of the present invention with reference to the accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

With reference to the accompanying drawings, based on the following detailed description, the present invention will be more clearly understood, wherein.

DESCRIPTION OF THE EMBODIMENTS

Figure 1A:
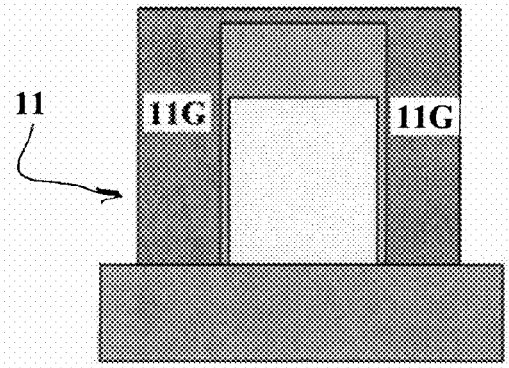
FIGS. 1A-1D schematically show four different prior art multi-gate structures.
Figure 1B:
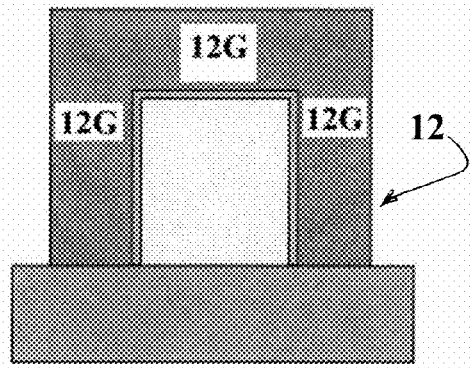
Figure 1C:
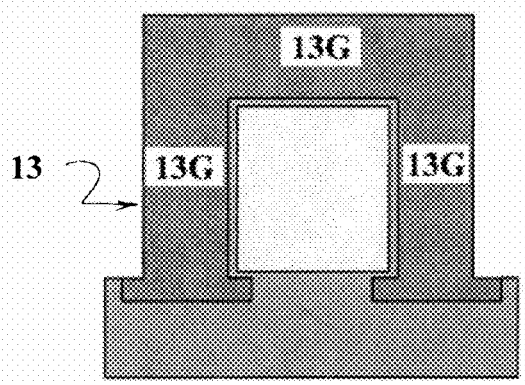
Figure 1D:
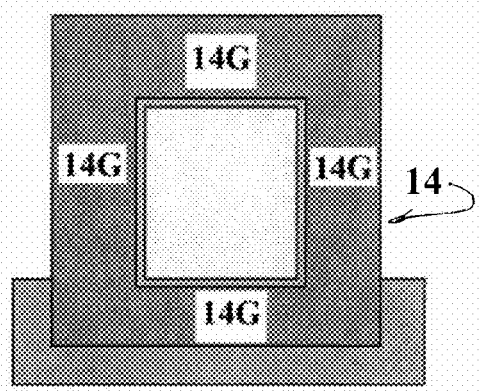

Various exemplary embodiments of the present invention are described in detail with reference to the drawings. The relative arrangement of the components and steps, the numerical expressions and the numerical values set forth in these embodiments are not intended to limit the scope of the present invention unless it is specifically stated otherwise.

For convenience of description, various components in the drawings have not necessarily been drawn to scale.

The following description of at least one exemplary embodiment is merely illustrative in nature and is in no way intended to limit the invention, its application or its uses.

Techniques, methods and apparatus as known by one of ordinary skill in the relevant art may not be discussed in detail but are intended to be part of the specification where appropriate.

In all of the examples illustrated and discussed herein, any specific values should be interpreted to be only illustrative and non-limiting. Thus, other examples of exemplary embodiments could have different values.

Similar reference numerals and letters refer to similar items in the following figures, and thus once an item is defined in one figure, it is possible that it is not further discussed for following figures.

Figure 2:
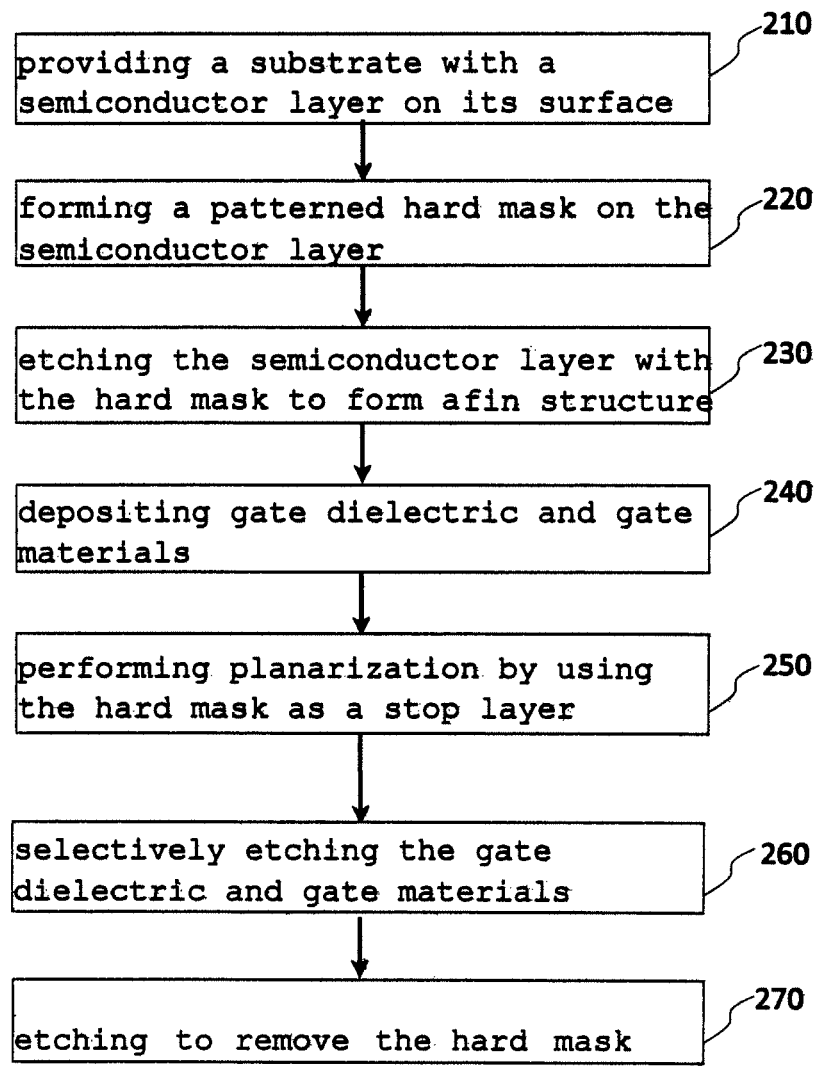
FIG. 2 is a flowchart schematically showing a process for fabricating a double gate structure according to embodiments of the present invention.

FIG. 2 is a flowchart schematically showing a process for fabricating a double gate structure according to embodiments of the present invention.

FIGS. 3A-3F are top views schematically showing different fabricating stages of a double gate structure according to one embodiment of the present invention.

With reference to the flowchart of the process shown in FIG. 2, a double gate structure according to one embodiment of the present invention at different fabricating stages as shown in FIGS. 3A-3F is described below.

At step 210, a substrate is provided with a semiconductor layer on its surface.

Next, at step 220, a patterned hard mask 300 is formed on the semiconductor layer.

The hard mask can include at least one of silicon nitride oxide and silicon nitride and a thickness of 50-100 Å.

Next, at step 230, the semiconductor layer is etched using the patterned hard mask, to form a fin structure 30.

Different fin structures can be formed by using different patterned hard masks. For example, the fin structure 30 can be provided with two end portions 301, 302 for forming source and drain regions and a middle portion 303 for forming a channel region that is located between the two end portions 301, 302, side surfaces 303f, 303f' of the middle portion 303 together with their respective adjacent side surfaces 301f, 301f', 302f, 302f' of the two end portions 301, 302, constitute two opposite side surfaces for the fin structure 30 that are perpendicular to the substrate surface, wherein a width of the middle portion 303 for forming a channel region 303W is larger than widths of the two end portions 301 and 302 for forming source and drain regions, 301W and 302W, as illustrated in FIG. 3A.

Figure 3A:
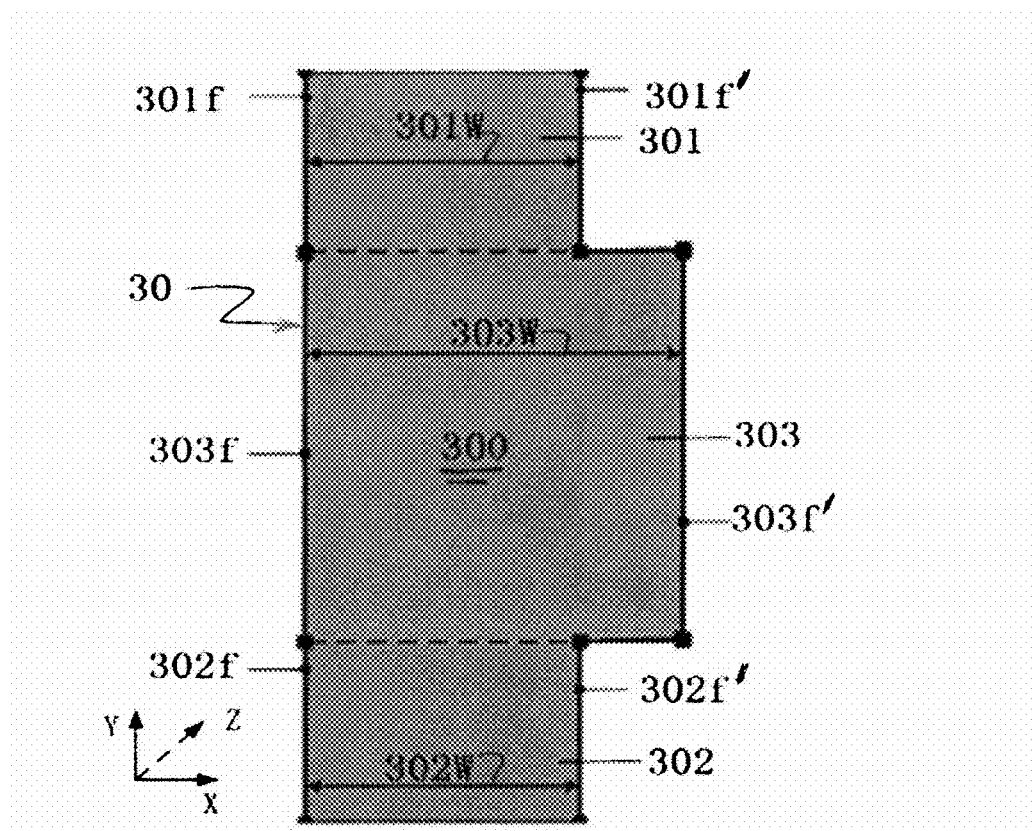
FIGS. 3A-3F are top views schematically showing different fabricating stages of a double gate structure according to one embodiment of the present invention.

Width direction runs along a horizontal direction plane, i.e. the X-direction as shown in FIG. 3A, channel length direction runs along the Y-direction, and the direction perpendicular to the substrate surface is the Z-direction as shown in FIG. 3A. In this specification, length, width and height (thickness) are described by using a general XYZ orthogonal coordinate system.

Figure 3B:
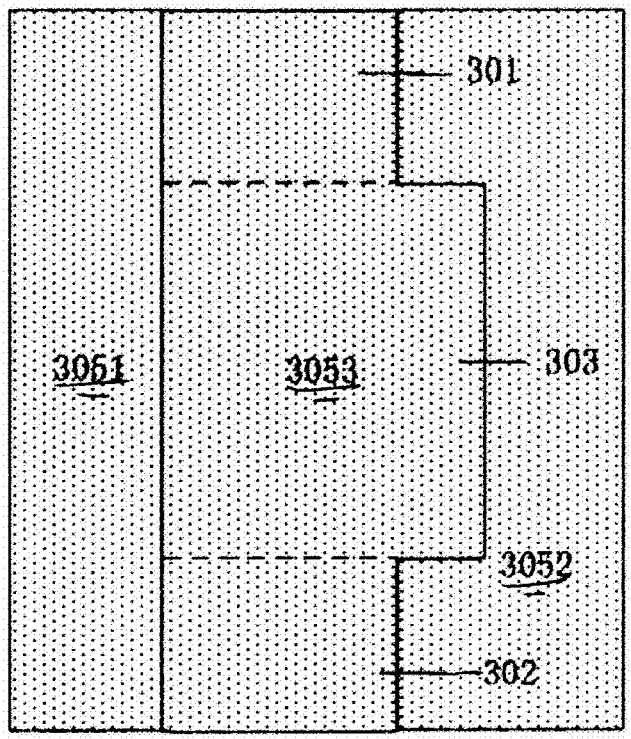

Next, at step 240, gate dielectric and gate materials are deposited, so as to form first stacked layers 3041, 3051 of the gate dielectric and gate materials on one side surface of the fin structure 30 and second stacked layers 3042, 3052 of the gate dielectric and gate materials on the other side surface of the fin structure, as well as to form third stacked layer 3053 of the gate dielectric and gate materials on the hard mask, as illustrated in FIG. 3B. Since the gate dielectric stays between the fin structure and the gate materials, only the gate materials 3051, 3052, 3053 can be seen in the top view of FIG. 3B while the gate dielectric cannot be seen.

The gate materials in the stacked layers each include at least one of poly-silicon, poly-germanium, poly-$Si_xGe_{1-x}$ and a metal. Depending on actual needs, the gate materials in the stacked layers can be the same, for example, they can all be poly-silicon. Alternatively, the gate materials in the stacked layers can be different, for example, poly-germanium can be employed as the gate material in the first stacked layer while a metal can be employed as the gate material in the second stacked layer.

The gate dielectric materials in the stacked layer can include at least one of silicon oxide, silicon nitride and silicon nitride oxide. The silicon nitride includes silicon nitride doped with P or F. Similar to the selection of the gate materials, the gate dielectric materials in the stacked layer can be selected to be the same or different.

For example, a situation in which the gate dielectric materials or the gate materials in the stacked layers are different can be achieved by using a selective etch process.

Figure 3C:
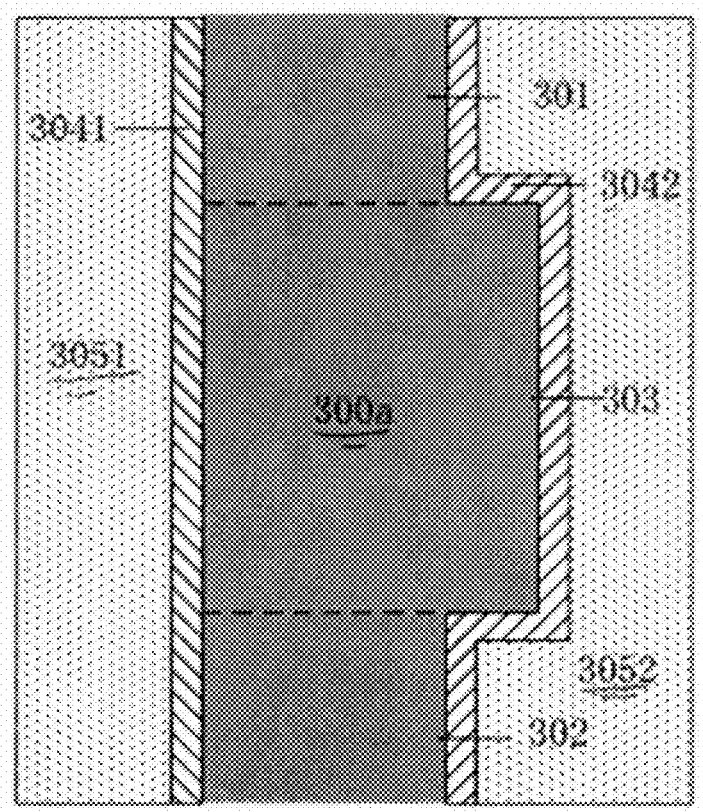

Then, at step 250, planarization is performed by using the hard mask 300 as a stop layer to remove the third stacked layers 3043, 3053 and maintain the first stacked layer 3041, 3051 and the second stacked layers 3042, 3052 on the two opposite side surfaces of the fin structure 30, as shown in FIG. 3C. After the planarization, the first stacked layers 3041, 3051 and the second stacked layers 3042, 3052 maintained on the two opposite side surfaces of the fin structure 30 are of the same height (or thickness).

The planarization can be performed by using a chemical mechanical polishing (CMP) process.

Next, at step 260, the gate dielectrics 3041, 3042 and the gate materials 3051, 3052 in the first stacked layer and the second stacked layer are selectively etched, so as to form a first gate dielectric layer 3041a and a second gate dielectric layer 3042a as well as a first gate 3051a and a second gate 3052a corresponding to the middle portion 303 for forming a channel region.

Figure 3D:
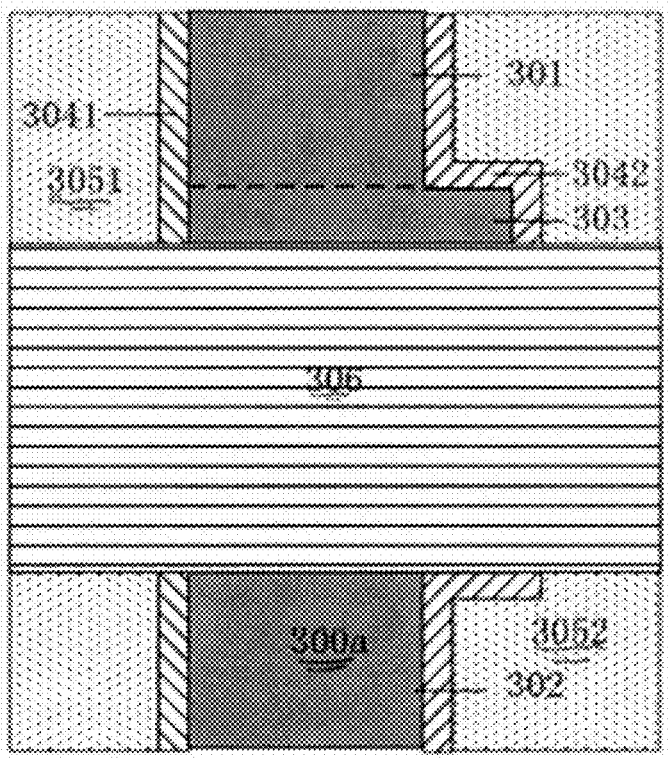

As known by one of ordinary skill in the art, the selective etching process can include processes like pattern exposure and etching. Patterns on a mask plate are transferred to a device surface that is coated with photo-resist by the pattern exposure process, as shown in FIG. 3D for example, and then only photo-resist 306 that corresponds to the pattern is maintained on the device surface after exposure and development.

The etching process etches off the portions that are not covered by the photo-resist 306 while the maintained photo-resist portion serves as a shelter film that protects each layer of materials below from being etched during the etching process. Based on the teaching herein, one of ordinary skill in the art can select a suitable dry etch process or a wet etch process depending on the materials to be etched.

Figure 3E:
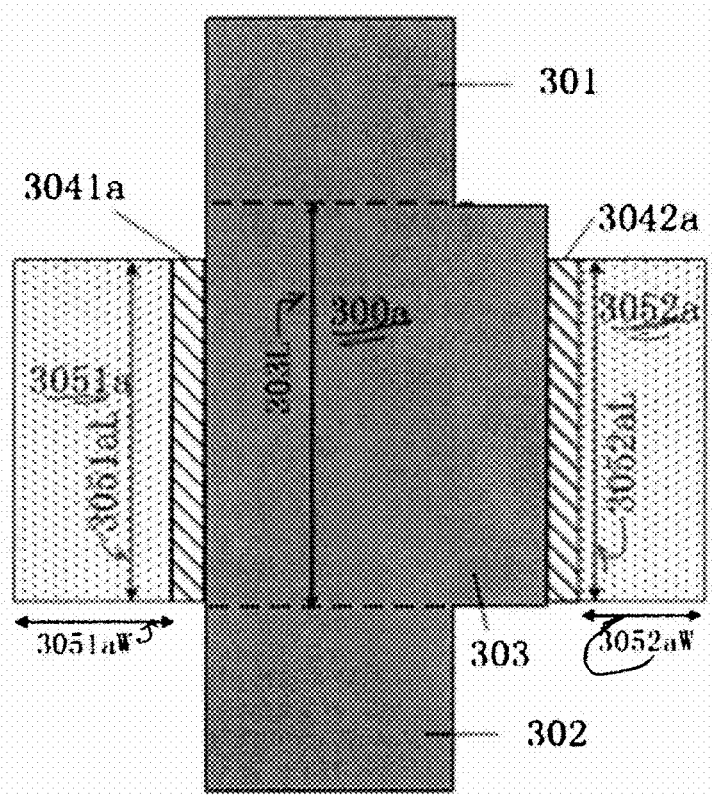

A suitable pattern can be selected such that the middle portion for forming a channel region has a length larger than at least one of the first gate and the second gate. In other words, a suitable pattern can be selected such that the middle portion for forming a channel region has a length only larger than one of the two gates. Other suitable pattern can be selected such that the length of the middle portion for forming a channel region 303L is larger than both of the length of the first gate 3051aL and the length of the second gate 3052aL, as illustrated in FIG. 3E.

In a MOSFET, it is typical to make the length of the gate dielectric the same as the length of the corresponding gate. During the selective etching, a double gate in which two gates are structurally symmetric can be formed by selecting a suitable pattern; for example, the two gates are of the same length and width. A double gate in which two gates are not structurally symmetric can also be formed by selecting a suitable pattern; for example, the two gates may be of different widths although they are of the same length, as illustrated in FIG. 3E, i.e. 3051aL=3052aL, 3051aW>3052aW. A double gate structure in which two gates are different both in length and in width or a double gate structure in which two gates are of the same width but different lengths can be formed by selecting a suitable pattern.

Figure 3F:
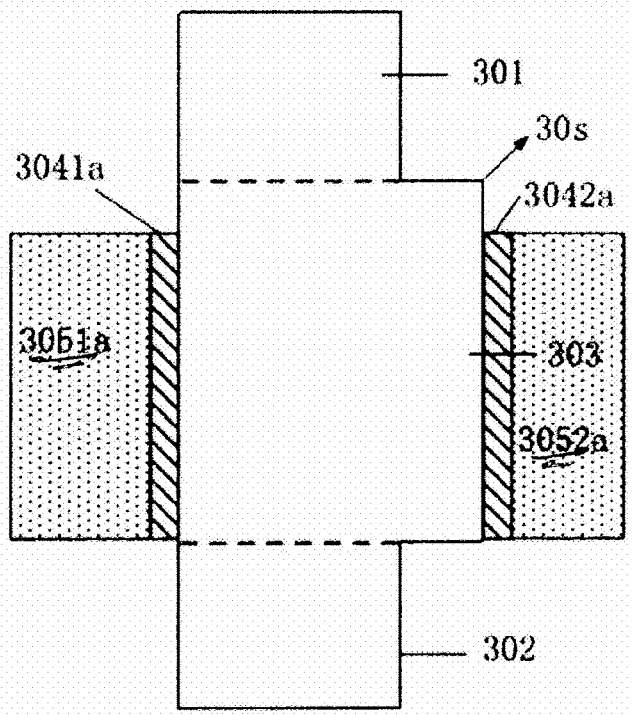

After the selectively etching, a further etching can be performed to remove the hard mask 300a (step 270), thereby forming the structure as shown in FIG. 3F.

With reference to the flowchart of the process shown in FIG. 2, the double gate structure, according to another embodiment of the present invention at different fabricating stages is described and shown in FIGS. 4A-4F.

FIGS. 4A-4F are top views schematically showing different fabricating stages for a double gate structure.

FIGS. 5A-5F are front views schematically showing the double gate structure corresponding to FIGS. 4A-4F at different fabricating stages.

First, at step 210, a substrate with a semiconductor layer on its surface is provided.

Next, at step 220, a patterned hard mask 400 is formed on the semiconductor layer.

The material of the hard mask can include at least one of silicon nitride oxide and silicon nitride; the hard mask has a thickness of 50-100 Å.

Next, at step 230, the semiconductor layer is etched using the patterned hard mask 400, so as to form a fin structure 40.

Different fin structures can be formed by using different patterned hard masks. For example, the fin structure 40 can be provided with two end portions 401, 402 for forming source and drain regions and a middle portion 403 for forming a channel region between the two end portions 401, 402, side surfaces 403f, 403f' of the middle portion 403 together with their respective adjacent side surfaces 401f, 401f', 402f, 402f' of the two end portions 401, 402 constitute two opposite side surfaces for the fin structure 40 perpendicular to the substrate surface, wherein a width of the middle portion 403 for forming a channel region 403W is larger than the widths of the two end portions 401, 402 for forming source and drain regions, 401W, 402W, as shown in FIG. 4A.

Figure 4A:
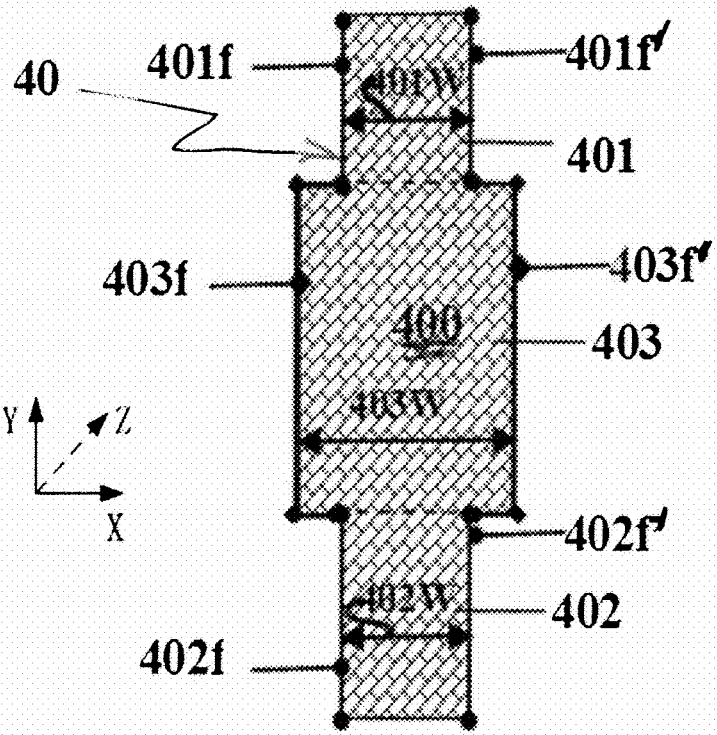
FIGS. 4A-4F are top views schematically showing different fabricating stages of a double gate structure according to another embodiment of the present invention.
Figure 5A:
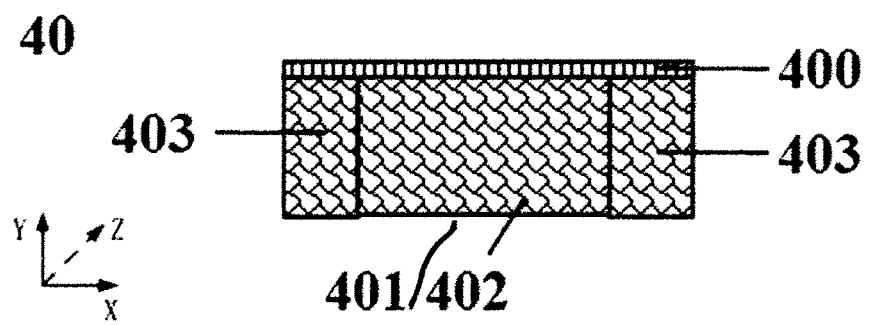
FIGS. 5A-5F are front views schematically showing different fabricating stages of the double gate structure corresponding to FIGS. 4A-4F.

Preferably, the middle portion 403 for forming a channel region extends beyond the two sides of the two end portions 401 and 402 for forming source and drain regions respectively along width direction, as illustrated in FIGS. 4A and 5A.

Figure 4B:
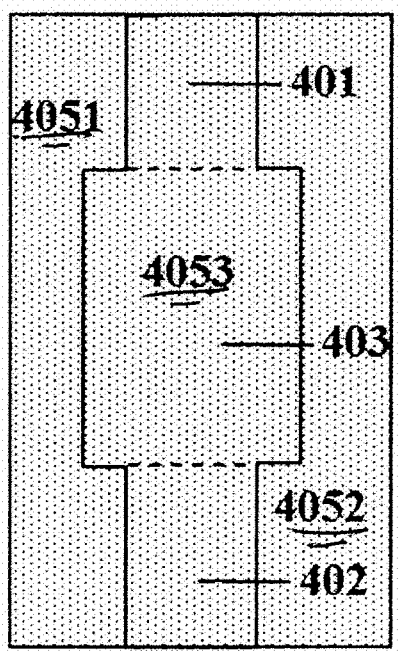
Figure 5B:
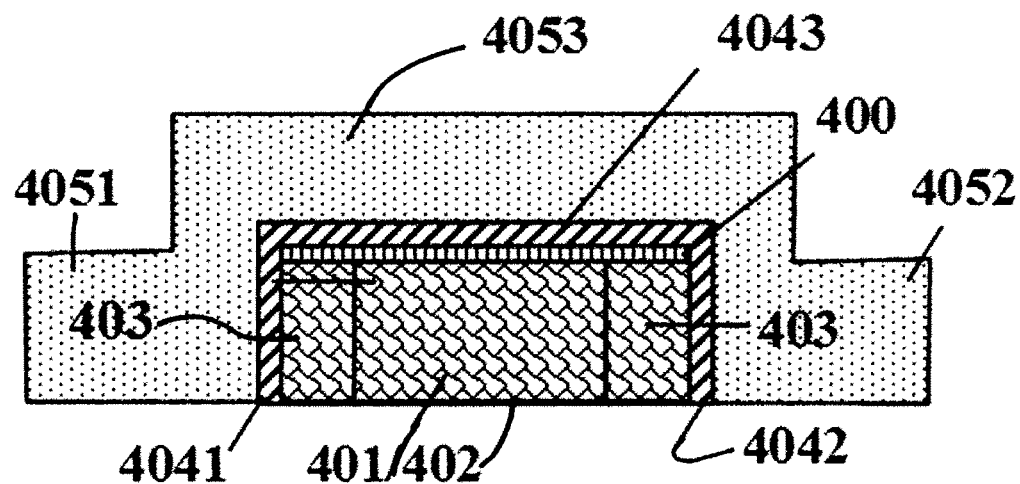

Next, at step 240, gate dielectric and gate materials are deposited, so as to form a first stacked layers 4041, 4051 of the gate dielectric and gate materials on one side surface of the fin structure 40 and second stacked layers 4042, 4052 of the gate dielectric and gate materials on the other side surface of the fin structure, as well as to form the one or more third stacked layer 4053 of the gate dielectric and gate materials on the hard mask, as illustrated in FIGS. 4B and 5B.

The gate materials in the stacked layers include at least one of poly-silicon, poly-germanium, poly-$Si_xGe_{1-x}$ and a metal.

Depending on actual needs, the gate materials in the stacked layers can be the same, for example, poly-silicon. Alternatively, the gate materials in the stacked layers can be different, for example, poly-germanium can be employed as the gate material in the first stacked layer while a metal can be employed as the gate material in the second stacked layer.

The gate dielectric materials in the stacked layer can include at least one of silicon oxide, silicon nitride and silicon nitride oxide. The silicon nitride can be silicon nitride doped with P or F. Similar to the selection of the gate materials, the gate dielectric materials in the stacked layer can be selected to be the same or different.

For example, a situation in which the gate dielectric materials or the gate materials in the stacked layers are different can be achieved by using a selective etch process.

Figure 4C:
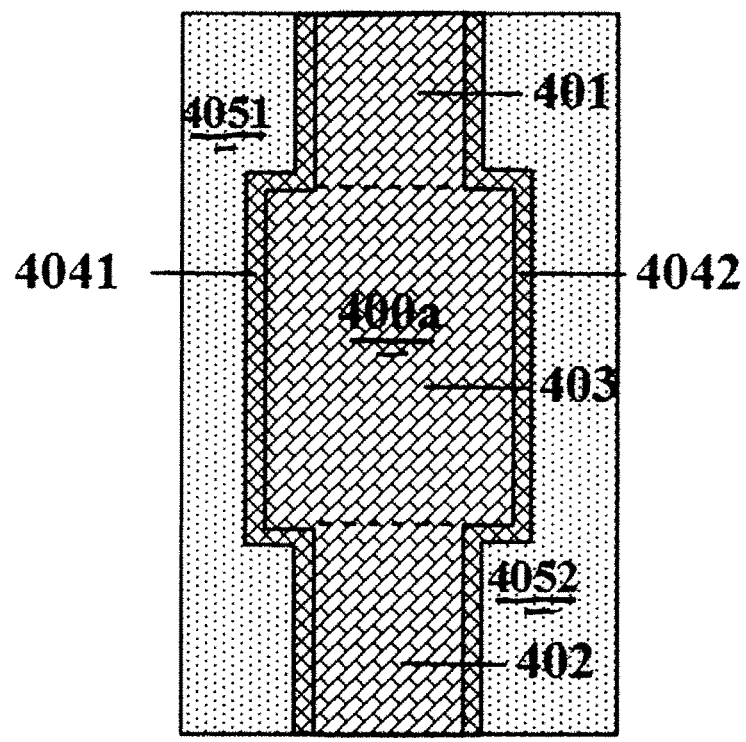
Figure 5C:
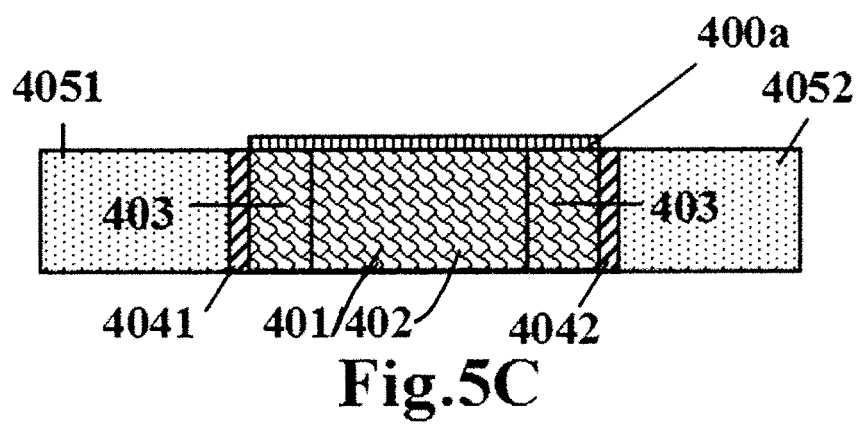

Then, at step 250, planarization is performed by using the hard mask 400 as a stop layer, so as to remove the one or more third stacked layers 4043, 4053 and maintain the first stacked layer 4041, 4051 and the second stacked layer 4042, 4052 on the two opposite side surfaces of the fin structure 40, as shown in FIGS. 4C and 5C. After the planarization, the first stacked layer 4041, 4051 and the second stacked layer 4042, 4052 maintained on the two opposite side surfaces of the fin structure 40 are of the same height.

Herein, the planarization can be performed by using a CMP process.

Next, at step 260, the gate dielectric 4041, 4042 and the gate materials 4051, 4052 in the first stacked layer and the second stacked layer are selectively etched, so as to form a first gate dielectric layer 4041a and a second gate dielectric layer 4042a as well as a first gate 4051a and a second gate 4052a corresponding to the middle portion 403 for forming a channel region.

Figure 4D:
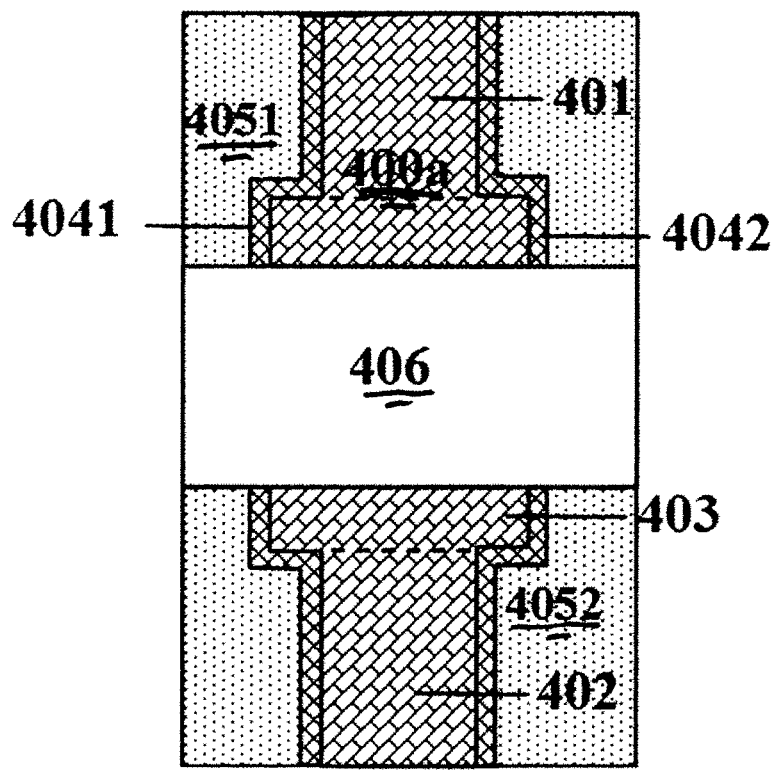
Figure 5D:
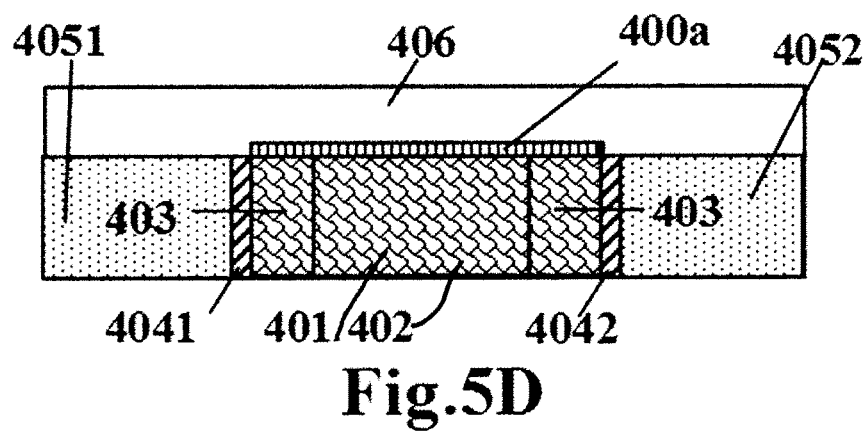

After the pattern exposure process, only the photo-resist 406 that corresponds to the pattern is maintained on the device surface, as shown in FIGS. 4D and 5D.

The etching process removes off the portions that are not covered by the photo-resist while the maintained photo-resist portion serves as a shelter film that protects each layer of materials below from being removed during the etching process. Based on the teachings herein, one of ordinary skill in the art can select a suitable dry etch process or a wet etch process depending on the materials to be removed.

A suitable pattern can be selected such that the middle portion for forming a channel region has a length larger than at least one of the first gate and the second gate. In other words, a suitable pattern can be selected such that the middle portion for forming a channel region has a length only larger than one of the two gates. Other suitable patterns can be selected such that the length of the middle portion for forming a channel region 403L is larger than both of the length 4051aL of the first gate and the length 4052aL of the second gate.

Figure 4E:
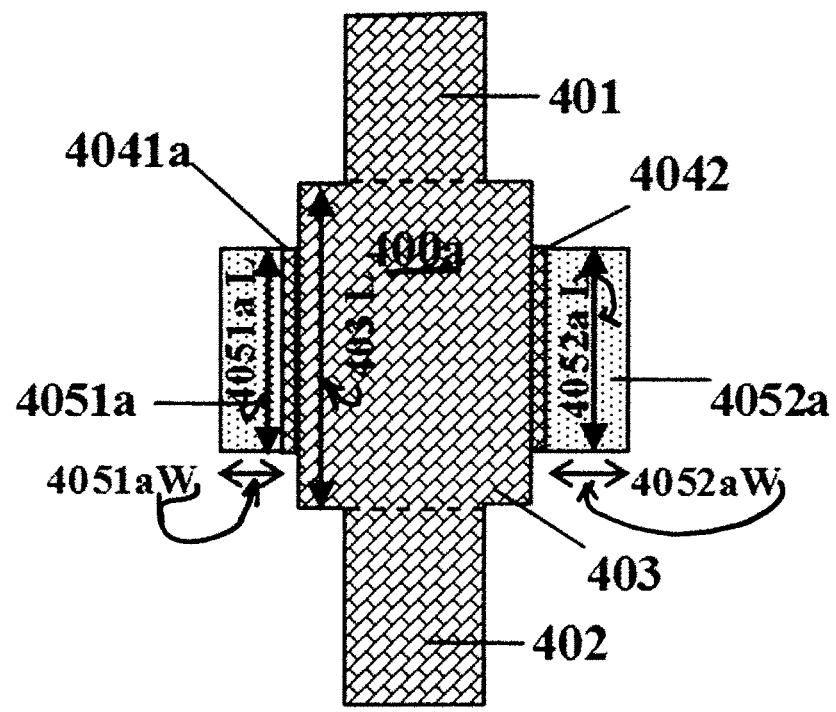
Figure 5E:
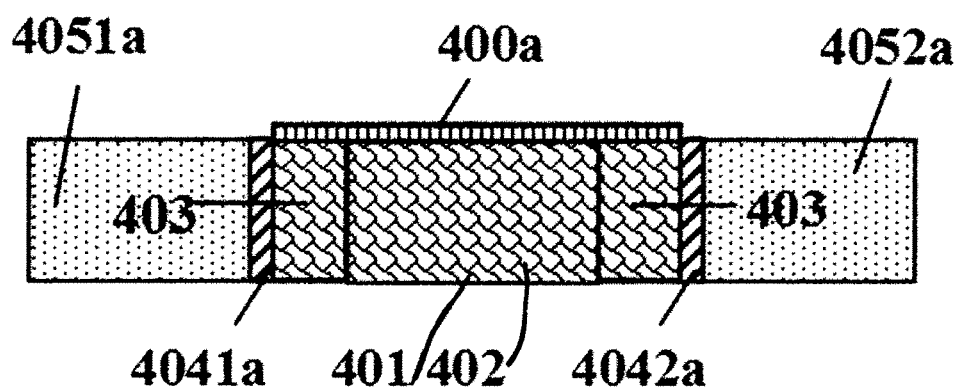

Preferably, the middle portion for forming a channel region extends beyond the two ends of the first gate along the length direction or extends beyond the two ends of the second gate along the length direction. More preferably, the middle portion for forming a channel region extends beyond the two ends of the first gate along the length direction and also extends beyond the two ends of the second gate along length direction, as shown in FIGS. 4E and 5E.

The length of the gate dielectric and the length of the corresponding gate are preferably the same. A double gate in which the two gates are structurally symmetric can be formed by selecting a suitable pattern, for example, where the two gates are of the same length and width. A double gate in which the two gates are not structurally symmetric can also be formed by selecting a suitable pattern, for example, as shown in FIGS. 4E and 5E, the two gates may be of different widths ($4051aW<4052aW$) although they are of the same length ($4051aL=4052aL$). A double gate structure can also be formed in which the two gates are different in both length and in width, or the two gates are of the same width but different length by selecting a suitable pattern.

Figure 4F:
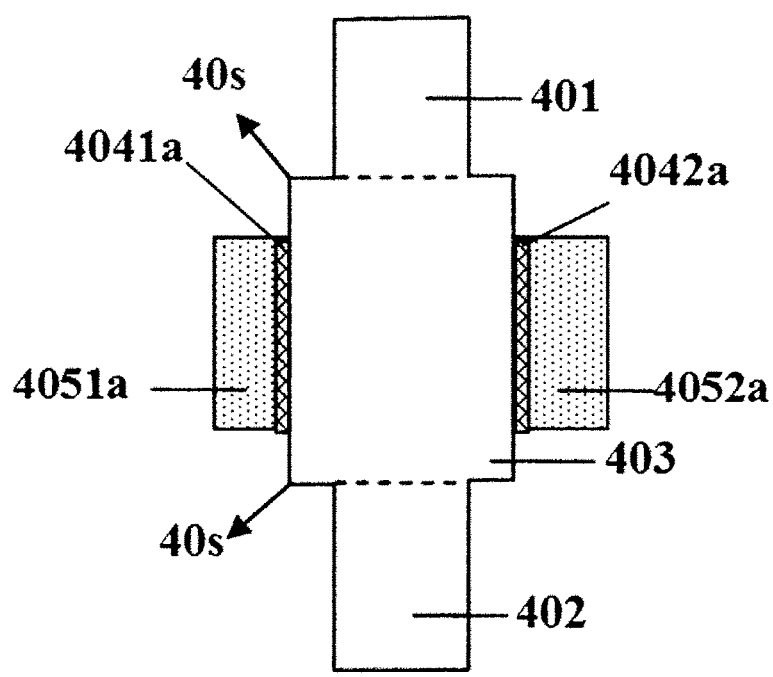
Figure 5F:
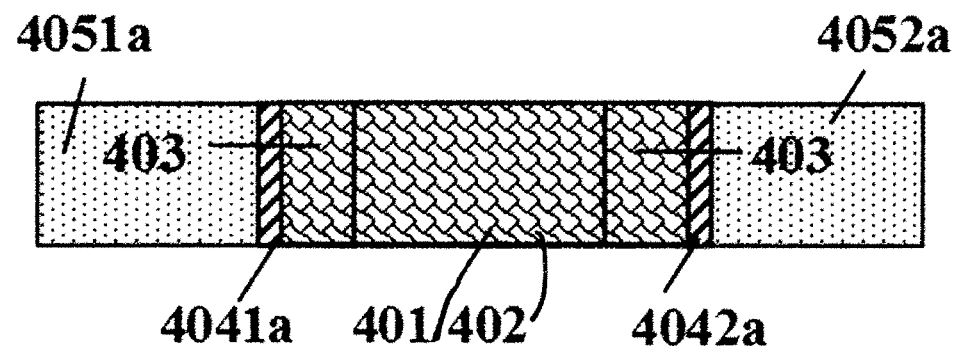

After selective etching, a further etching can be performed to remove the hard mask 400a (step 270), thereby forming the structure as shown in FIGS. 4F and 5F.

Figure 6:
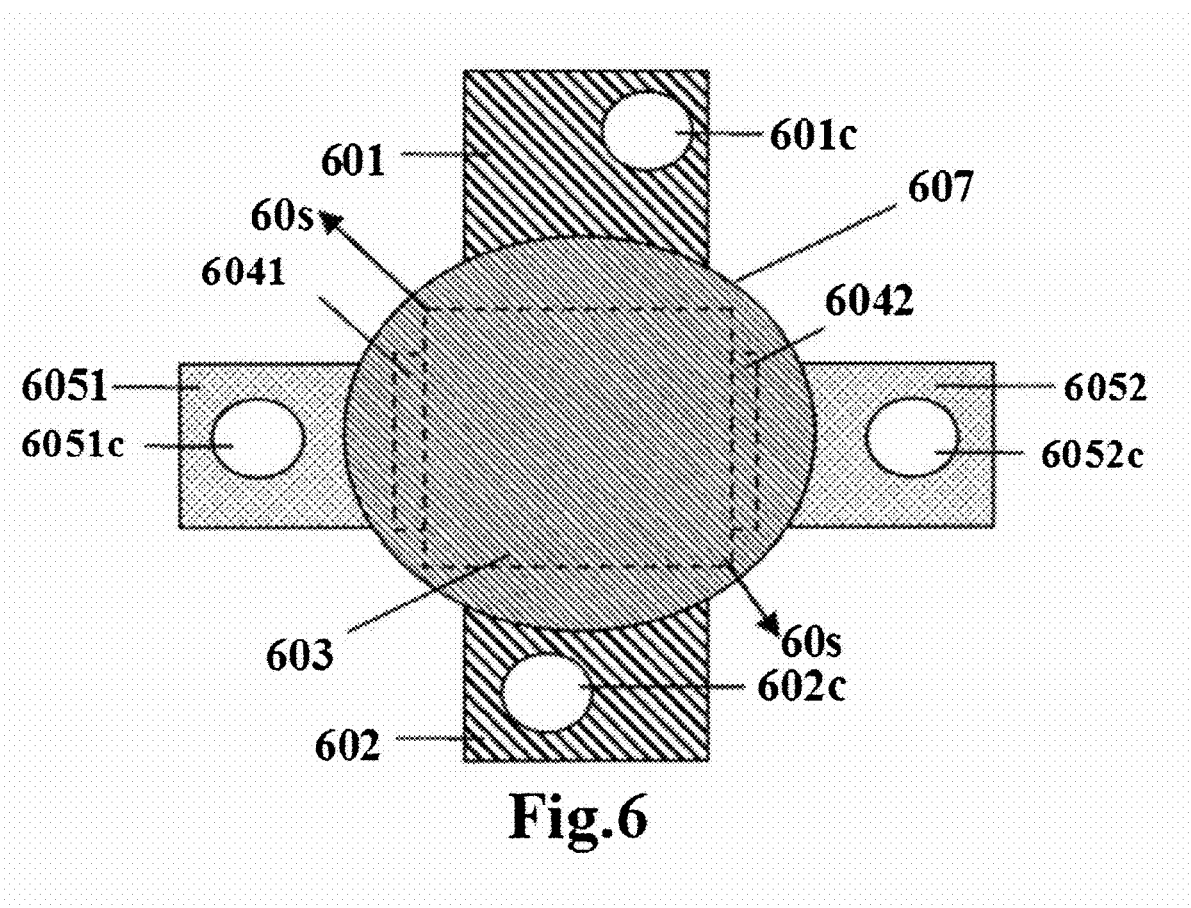
FIG. 6 is a diagram schematically showing a double gate structure with a stress layer and a contact disposed thereon.

FIG. 6 is a diagram schematically showing a double gate structure with a stress layer and a contact disposed thereon.

As shown in FIG. 6, contacts 601c, 602c, 6051c, 6052c can be fabricated on the two end portions 601, 602 for forming source and drain regions and the gates 6051, 6052 respectively, so as to connect with other devices. One of ordinary skill in the art can select suitable materials for contacts on the source and drain regions as needed. Materials for the contacts on the two gates can include at least one of W, Cu and Al. The contacts on the two gates can be of the same material or different materials.

In order to facilitate the effective application of stress on the channel, a double gate structure can be formed in which the middle portion, for forming a channel region, has a width larger than the two end portions, for forming source and drain regions, and a length larger than at least one of the first gate and the second gate. The thus-formed double gate structure has a step structure 30s that is advantageous for applying stress on the channel, as illustrated in FIG. 3F.

In order to more effectively apply stress on the channel, a step structure 40s as shown in FIG. 4F, can be formed, in which the middle portion for forming a channel region extends beyond the two sides of the two end portions for forming source and drain regions along the width direction, extends beyond the two ends of the first gate along the length direction, and extends beyond the two ends of the second gate along the length direction. A multi-step structure 40s which is formed in such way is more advantageous for applying stress on the channel. For example, in order to effectively apply stress on the channel, a stress layer 607 can be disposed on the double gate transistor. The stress layer 607 as shown in FIG. 6 covers a step structure 60s, that is, covers the whole of the middle portion 603, for forming a channel region, the whole of the first gate dielectric layer 6041 and the second gate dielectric layer 6042, a portion of the first gate 6051, a portion of the second gate 6052, and a portion of the two end portions 601, 602, for forming source and drain regions. Materials of the stress layer can include silicon nitride in a compressive stress state or silicon nitride in a tensile stress state.

For the working needs of the device, preferably, the length that the middle portion for forming a channel region extends beyond at least one of the two ends of the first gate along length direction is ⅕-⅙ of the length of the first gate, or the length that the middle portion for forming a channel region extends beyond at least one of the two ends of the second gate along length direction is ⅕-⅙ of the length of the second gate. More preferably, the length that the middle portion for forming a channel region extends beyond at least one of the two ends of the first gate along length direction is ⅕-⅙ of the length of the first gate, and the length that the middle portion for forming a channel region extends beyond at least one of the two ends of the second gate along length direction is ⅕-⅙ of the length of the second gate.

The method of fabricating a semiconductor device according to the present invention as well as a semiconductor device formed thereby has been described in detail. In this specification, terms like "first" and "second" can be interchanged. In order to not obscure the concept of the present invention, some details already known in the art are not described. However, one of ordinary skill in the art based on the teachings herein will know how to implement the technical solutions disclosed.

Although some specific embodiments of the present invention have been demonstrated in detail with examples, it is understood by a person of ordinary skill in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A double gate transistor, comprising:
a semiconductor layer on a substrate;
a fin structure formed in said semiconductor layer, said fin structure having two end portions for forming source and drain regions and a middle portion between said two end portions for forming a channel region, said middle portion including first and second parallel side surfaces perpendicular to a substrate surface;
a first gate dielectric layer and a first gate disposed on the first side surface of said middle portion; and
a second gate dielectric layer and a second gate disposed on the second side surface of said middle portion, characterized in that:
said middle portion has a width larger than the width of the two end portions for forming source and drain regions, said middle portion has a length larger than the length of at least one of the first gate and the second gate, and
a height of said first gate and a height of said second gate are both the same as a height of said middle portion, wherein the length runs along channel direction, the height runs along a direction perpendicular to the substrate surface, and the width runs along a direction perpendicular to the length and the height.

2. The double gate transistor of claim 1, wherein said first gate dielectric layer and said first gate are of the same length and said second dielectric layer and said second gate are of the same length.

3. The double gate transistor of claim 1, wherein said first gate dielectric layer and said first gate are of the same height and said second dielectric layer and said second gate are of the same height.

4. The double gate transistor of claim 1, wherein said first gate and said second gate are of different lengths.

5. The double gate transistor of claim 1, wherein said first gate and said second gate are of the same length.

6. The double gate transistor of claim 1, wherein said first gate and said second gate are of different widths.

7. The double gate transistor of claim 1, wherein said first gate and said second gate are of the same width.

8. The double gate transistor of claim 1, wherein said middle portion extends along the width direction beyond two sides of the two end portions.

9. The double gate transistor of claim 1, wherein said middle portion extends along the length direction beyond the two ends of said first gate.

10. The double gate transistor of claim 9, wherein said middle portion has a length that is ⅕~⅙ greater than the length of said first gate.

11. The double gate transistor of claim 1, wherein said middle portion extends along the length direction beyond the two ends of said second gate.

12. The double gate transistor of claim 11, wherein the middle portion has a length that is ⅕~⅙ greater than the length of said second gate.

13. The double gate transistor of claim 1, wherein the materials of said first gate and said second gate comprises at least one of poly-silicon, poly-germanium, poly-silicon germanium and a metal.

14. The double gate transistor of claim 13, wherein said first gate and said second gate comprise different materials.

15. The double gate transistor of claim 13, wherein said first gate and said second gate comprise the same material.

16. The double gate transistor of claim 1, further comprising a first contact and a second contact disposed on said first gate and said second gate, respectively.

17. The double gate transistor of claim 16, wherein the materials of said first contact and said second contact comprises at least one of W, Cu and Al.

18. The double gate transistor of claim 17, wherein said first contact and said second contact comprise the same material.

19. The double gate transistor of claim 17, wherein said first contact and said second contact comprise different materials.

20. The double gate transistor of claim 1, wherein the materials of said first gate dielectric layer and said second gate dielectric layer comprise at least one of silicon oxide, silicon nitride and silicon nitride oxide.

21. The double gate transistor of claim 20, wherein said first gate dielectric layer and said second gate dielectric layer comprise the same material.

22. The double gate transistor of claim 20, wherein said first gate dielectric layer and said second gate dielectric layer comprise different materials.

23. The double gate transistor of claim 20, wherein said silicon nitride is doped with P.

24. The double gate transistor of claim 20, wherein said silicon nitride is doped with F.

25. The double gate transistor of claim 1, further comprising a stress layer disposed on said double gate transistor, wherein said stress layer covers the whole of said middle portion, the whole of said first gate dielectric layer and said second gate dielectric layer, a portion of said first gate, a portion of said second gate, and a portion of said two end portions.

26. The double gate transistor of claim 25, wherein said stress layer comprises at least silicon nitride in a compressive stress state.

27. The double gate transistor of claim 25, wherein said stress layer comprises at least silicon nitride in a tensile stress state.

28. A method of fabricating a double gate transistor, comprising:
providing a substrate with a semiconductor layer on its surface;
forming a patterned hard mask on said semiconductor layer;
etching said semiconductor layer with the hard mask to form a fin structure, said fin structure having two end portions for forming source and drain regions and a middle portion between said two end portions, side surfaces of said middle portion together with the respective adjacent side surfaces of said two end portions constituting two opposite side surfaces of said fin structure that are perpendicular to the substrate surface, wherein said middle portion has a width larger than the two end portions for forming source and drain regions;
depositing gate dielectric and gate materials, so as to form a first stacked layer of the gate dielectric and gate materials on one side surface of said fin structure and a second stacked layer of the gate dielectric and gate materials on the other side surface of said fin structure, as well as to form a third stacked layer of the gate dielectric and gate materials on said hard mask;
performing planarization by using said hard mask as a stop layer, so as to remove said third stacked layer and maintain said first stacked layer and said second stacked layer on the two opposite side surfaces of said fin structure, wherein the height of said first stacked layer and the height of said second stacked layer are both the same as the height of said middle portion; and
selectively etching the gate dielectric and gate materials in said first stacked layer and said second stacked layer, so as to form a first gate dielectric layer and a second gate dielectric layer as well as a first gate and a second gate corresponding to said middle portion, and such that said middle portion has a length larger than at least one of the first gate and the second gate,
wherein the length runs along channel direction, the height runs along a direction perpendicular to the substrate surface, and the width runs along a direction perpendicular to the length and the height respectively.

29. The method of claim 28, wherein said first gate dielectric layer and said first gate are of the same length, and said second gate dielectric layer and said second gate are of the same length.

30. The method of claim 28, wherein the planarization is performed by using a chemical mechanical polishing process.

31. The method of claim 28, wherein said first gate and said second gate are of different lengths.

32. The method of claim 28, wherein said first gate and said second gate are of the same length.

33. The method of claim 28, wherein said first gate and said second gate are of different widths.

34. The method of claim 28, wherein said first gate and said second gate are of the same width.

35. The method of claim 28, wherein said middle portion extends along the width direction beyond two sides of said two end portions.

36. The method of claim 28, wherein said middle portion extends along the length direction beyond the two ends of said first gate.

37. The method of claim 36, wherein the middle portion has a length greater than the length of said first gate by ⅕~⅙ thereof.

38. The method of claim 28, wherein said middle portion extends along the length direction beyond the two ends of said second gate.

39. The method of claim 28, wherein the middle portion has a length greater than the length of said second gate by ⅕~⅙ thereof.

40. The method of claim 28, wherein materials of said first gate and said second gate comprise at least one of poly-silicon, poly-germanium, poly-silicon germanium and metal.

41. The method of claim 40, wherein said first gate and said second gate comprise different materials.

42. The method of claim 40, wherein said first gate and said second gate comprise the same material.

43. The method of claim 28, further comprising removing said hard mask after the selective etching.

44. The method of claim 43, further comprising forming a first contact and a second contact on said first gate and said second gate, respectively.

45. The method of claim 44, wherein the materials of said first contact and said second contact comprise at least one of W, Cu and Al.

46. The method of claim 45, wherein said first contact and said second contact comprise the same material.

47. The method of claim 45, wherein said first contact and said second contact comprise different materials.

48. The method of claim 28, wherein the material of said hard mask comprises at least one of silicon nitride oxide and silicon nitride.

49. The method of claim 28, wherein said hard mask has a thickness of 50~100Å.

50. The method of claim 28, wherein the materials of said first gate dielectric layer and said second gate dielectric layer comprise at least one of silicon oxide, silicon nitride and silicon nitride oxide.

51. The method of claim 50, wherein said first gate dielectric layer and said second gate dielectric layer comprise the same material.

52. The method of claim 50, wherein said first gate dielectric layer and said second gate dielectric layer comprise different materials.

53. The method of claim 50, wherein said silicon nitride is doped with P.

54. The method of claim 50, wherein said silicon nitride is doped with F.

55. The method of claim 43, further comprising disposing a stress layer on said double gate transistor, wherein said stress layer covers the whole of said middle portion, the whole of said first gate dielectric layer and said second gate dielectric layer, a portion of said first gate, a portion of said second gate, and a portion of said two end portions.

56. The method of claim 55, wherein the material of said stress layer comprises at least silicon nitride in a compressive stress state.

57. The method of claim 55, wherein a material of said stress layer comprises at least silicon nitride in a tensile stress state.

\* \* \* \* \*